(12) United States Patent
Ramanathan et al.

(10) Patent No.: US 8,030,782 B2
(45) Date of Patent: Oct. 4, 2011

(54) METAL-METAL BONDING OF COMPLIANT INTERCONNECT

(75) Inventors: Shriram Ramanathan, Portland, OR (US); Sriram Muthukumar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/789,886

(22) Filed: May 28, 2010

(65) Prior Publication Data
US 2010/0237505 A1    Sep. 23, 2010

Related U.S. Application Data

(63) Continuation of application No. 10/917,041, filed on Aug. 11, 2004, now Pat. No. 7,750,487.

(51) Int. Cl.
*H01L 23/48* (2006.01)
(52) U.S. Cl. .. 257/785; 257/773; 257/780; 257/E23.022
(58) Field of Classification Search .................. 257/773, 257/780, 784, 785, E23.015, E23.022, E23.143, 257/E23.151
See application file for complete search history.

(56) References Cited

U.S. PATENT DOCUMENTS

| 7,400,041 | B2 * | 7/2008 | Muthukumar et al. | ....... 257/750 |
| 2002/0164893 | A1 * | 11/2002 | Mathieu et al. | ................. 439/66 |

* cited by examiner

*Primary Examiner* — Matthew E Warren
(74) *Attorney, Agent, or Firm* — Kathy J. Ortiz

(57) ABSTRACT

Embodiments of the invention provide a first component with a compliant interconnect bonded to a second component with a land pad by a metal to metal bond. In some embodiments, the first component may be a microprocessor die and the second component a package substrate.

10 Claims, 10 Drawing Sheets

METAL-METAL BONDING OF COMPLIANT INTERCONNECT

BACKGROUND OF THE INVENTION

To make an integrated circuit device, such as microprocessors or other related computer components, a microelectronic die is often bonded to another component, such as a package substrate. Interconnects between the die and the package substrate transmit electrical signals between the two components. For performance and other reasons, modern semiconductor packages and MEMS (micro electromechanical systems) often employ ultra low k (dielectric value) interlayer dielectric layers, which typically have low mechanical strength. Accordingly, the interlayer dielectric layers are more sensitive to stress. Further, solders typically used in part to form the interconnects between the components can cause harmful effects and may be, in some cases, unlawful to use in the near future.

DETAILED DESCRIPTION

Figure 1:
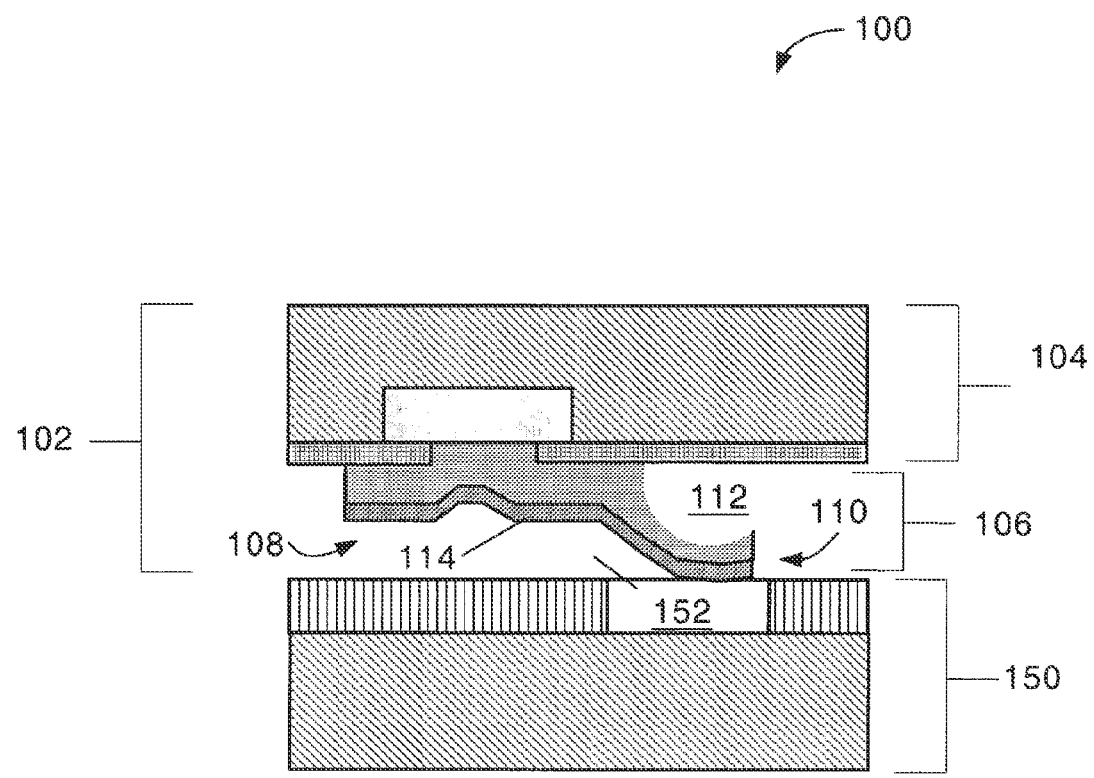
FIG. 1 is a side cross sectional view of a bonded apparatus according to one embodiment of the invention.

FIG. 1 is a side cross sectional view of a bonded apparatus 100 according to one embodiment of the invention. The apparatus 100 includes a microelectronic die 102, such as a microprocessor die 102. In some embodiments, a device other than a microelectronic die 102 may used instead of the die. For the purposes of the description of one embodiment below, the die 102 will be described as a microprocessor die 102, although it may be other devices in other embodiments.

The die 102 may include a die substrate 104. The die substrate 104 may include one or more layers and devices. The substrate 104 may include conducting material, insulating material, semiconducting material, and other materials or material combinations. For example, in an embodiment where the device 102 is a microprocessor die, the substrate 104 may include many millions of transistors.

The die 102 may also include a compliant interconnect 106. The compliant interconnect 106 may be electrically connected to various devices of the die substrate 104. The compliant interconnect may include a fixed portion 108 and a spring portion 110. The fixed portion 108 may be a portion of the compliant interconnect that is in direct contact with the die substrate 104 so that the fixed portion 108 is substantially constrained by the die substrate 104 from moving; the fixed portion 108 will remain substantially static relative to the die substrate 104. The spring portion 110, in contrast, may move relative to the die substrate 104. There may be a gap 112 between the spring portion 110 and the die substrate 104 so that if a force is applied to the spring portion 110 perpendicular to the die substrate 104, the spring portion 110 may flex closer to the die substrate 104. This provides the compliant interconnect 106 with its compliancy. The flexing of the spring portion 110 may in some situations prevent large forces from being transferred to the die substrate 104, where the forces may cause mechanical failure of devices or layers, such as a low dielectric constant dielectric layer.

The compliant interconnect 106 may also include a bonding layer 114. The bonding layer 114 may be used to bond the compliant interconnect 106, and thus the die 102, to another component. The bonding layer 114 may be over substantially all of the fixed portion 108 and the spring portion 110 of the compliant interconnect 106, as illustrated, in some embodiments. In other embodiments, the bonding layer 114 may cover only a part of the spring portion 110 and/or fixed portion 108. For example, in an embodiment, the bonding layer 114 may cover only a portion of area of the spring portion 110, and not extend to the fixed portion 108. In yet other embodiments, the bonding layer 114 may be the only layer that forms the spring portion 110 and/or the fixed portion 108, rather than just one of multiple layers of the spring portion 110 and/or the fixed portion 108.

The bonding layer 114 may comprise a metal such as Copper (Cu), Gold (Au), or Silver (Ag) in some embodiments. In other embodiments other suitable metals for bonding, such as Ruthenium (Ru), Osmium (Os), Iridium (Ir), Palladium (Pd), Rhodium (Rh), Platinum (Pt), or alloys thereof, may be used for the bonding layer 114. In other embodiments, the bonding layer 114 may comprise any metal that facilitates bonding to a metal bonding layer on another component, as will also be described below. In a further embodiment, the bonding layer 114 comprises a metal that enables a metal to metal bond at a relatively low temperature (e.g., 400° C., or less), which can increase throughput. In yet another embodiment, the bonding layer 114 comprises a metal that inhibits corrosion of the compliant interconnect 106 (e.g., the formation of native oxides), and in yet a further embodiment, the bonding layer 114 comprises a metal that can inhibit electromigration of conductor material of the compliant interconnect 106 surrounding structures.

The bonded apparatus 100 may also include a component 150 to which the microprocessor die 102 may be bonded. In an embodiment, the component 150 may be a package substrate 150. For the purposes of the description of one embodiment below, the component 150 will be described as a package substrate 150 to which a microprocessor die 102 is bonded, although the component 150 may be other non-package substrate devices in other embodiments.

The package substrate 150 may be a substrate with multiple dielectric/insulating layers, multiple layers of conductive traces, and a number of vias connecting conductive traces on different layers. The package substrate 150 may be bonded and electrically connected to a die 102 to provide the die 102 with additional mechanical support and spread electrical contacts of the die 102 to facilitate further electrical connections to the die 102 through the substrate 150. The electrical connections between the die 102 and the package substrate 150 may be made by one or more land pads 152 on the package substrate 150 being in contact with conductors of the die 102.

In an embodiment, the land pads 152 may also each have a bonding layer. In an embodiment, the entire land pad 152 may function as a bonding layer. In another embodiment (illustrated in FIG. 5*a*), the bonding layer of the land pad 152 may be a layer at the exterior of the land pad 152. The bonding layer of the land pad 152 may comprise a metal such as Copper (Cu), Gold (Au), or Silver (Ag) in some embodiments. In other embodiments other suitable metals for bonding, such as Ruthenium (Ru), Osmium (Os), Iridium (Ir), Palladium (Pd), Rhodium (Rh), Platinum (Pt), or alloys thereof, may be used for the bonding layer of the land pad 152. In other embodiments, the bonding layer of the land pad 152 may comprise any metal that facilitates bonding to a metal bonding layer on another component, such as the bonding layer 114 of the compliant interconnect 106. In a further embodiment, the bonding layer of the land pad 152 comprises a metal that enables a metal to metal bond at a relatively low temperature (e.g., 400° C., or less), which can increase throughput. In yet another embodiment, the bonding layer of the land pad 152 comprises a metal that inhibits corrosion (e.g., the formation of native oxides) of the rest of the land pad 152 (if the bonding layer is only part of the land pad 152) or conductors adjacent the land pad 152 (if the bonding layer makes up substantially the entire land pad 152), and in yet a further embodiment, the bonding layer of the land pad 152 comprises a metal that can inhibit electromigration of conductor material of the land pad 152 and/or package substrate 150 or other surrounding structures. The bonding layer of the land pad 152 may comprise the same material as the bonding layer 114 of the compliant interconnect 106 in some embodiments. In other embodiments, the bonding layer of the land pad 152 may comprise a different material from the bonding layer 114 of the compliant interconnect 106.

The bonding layer of the land pad 152 may be used to bond the land pad 152, and thus the package substrate 150, to another component, such as the compliant interconnect 106 (and thereby the die 102). In an embodiment, the bonding layer 114 of the compliant interconnect 106 and the bonding layer of the land pad 152 may be exposed to heat and pressure to form a metal to metal bond. This may result in the two bonding layers becoming one unified interlayer. Thus, while FIG. 1 illustrates the bonding layers of the compliant interconnect 106 and the land pad 152 as two separate layers with a boundary between the two, they may actually become a single physical layer (the unified interlayer) when bonded together.

By creating the metal to metal bond to form the unified interlayer from the bonding layer 114 of the compliant interconnect 106 and the bonding layer of the land pad 152, the die 102 and the package substrate 150 may be bonded together without the use of solder. Thus, in some embodiments no solder is used to connect the compliant interconnects 106 to the land pads 152. Solder may be a material that includes a portion of a conductor, such as lead or tin, that melts at a relatively low temperature, such as below 400 degrees Celsius.

FIGS. 2*a* through 2*h* are cross sectional side views that illustrate formation of the compliant interconnect 106, according to one embodiment of the present invention. In other embodiments, the compliant interconnect 106 may be formed differently and with different layers/structures.

Figure 2A:
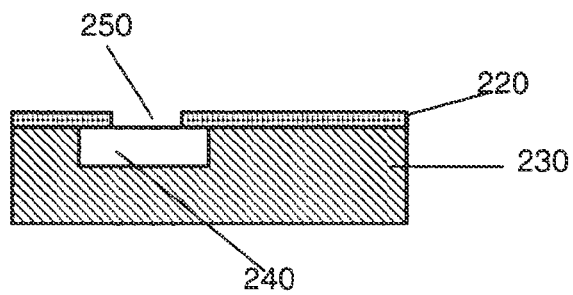
FIGS. 2a through 2h are cross sectional side views that illustrate formation of the compliant interconnect.

FIG. 2*a* illustrates a substrate 230 with a pad 240 and an opening 250 exposing the pad 240, which may be formed by any one of a number of known techniques. The substrate 230 may be a silicon (Si) substrate in an embodiment, and a passivation layer 220 (also referred to as a dielectric layer 220) of silicon nitride (SiN) may be formed on the substrate 230. In another embodiment, the passivation layer 220 may be polyimide or another material.

Figure 2B:
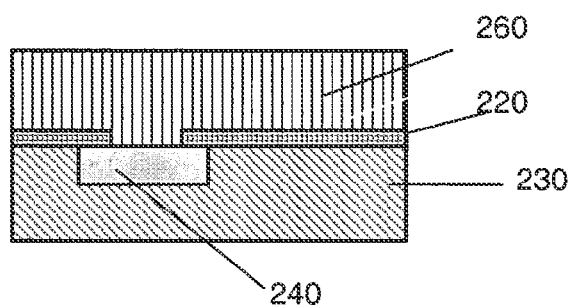
Figure 2C:
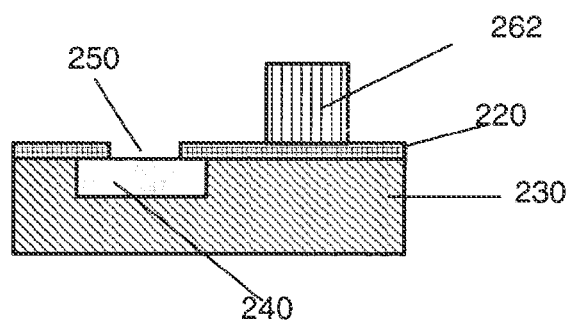
Figure 2D:
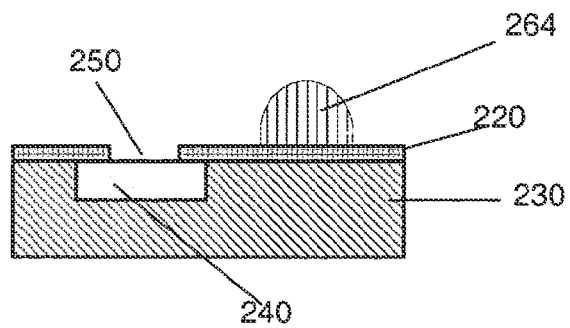

FIG. 2*b* illustrates a layer of photoresist 260 deposited on the dielectric layer 220 and pad 240. FIG. 2*c* illustrates the layer of photoresist 260 after it has been patterned to create a polymer column 262. FIG. 2*d* illustrates a polymer dome 264 created by reflowing the polymer column 262, which may be done in a number of different ways.

Figure 2E:
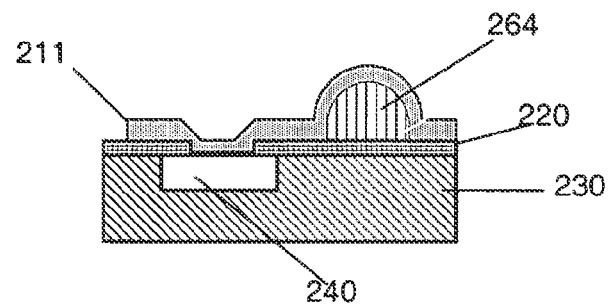

FIG. 2*e* illustrates a first metal layer 211 deposited on the dielectric layer 220, over the opening 250, and on the polymer dome 264. The first metal layer 211 may be a metal such as aluminum (Al), copper (Cu), titanium (Ti), nickel (Ni), platinum (Pt), gold (Au), silver (Ag), tin (Sn), tantalum (Ta), molybdenum (Mo), chromium (Cr), cobalt (Co), or another material or alloy. The first metal layer 211 may be deposited by employing a method such as sputtering, chemical vapor deposition, physical vapor deposition, atomic layer deposition, electro plating, electroless plating, or another method.

Figure 2F:
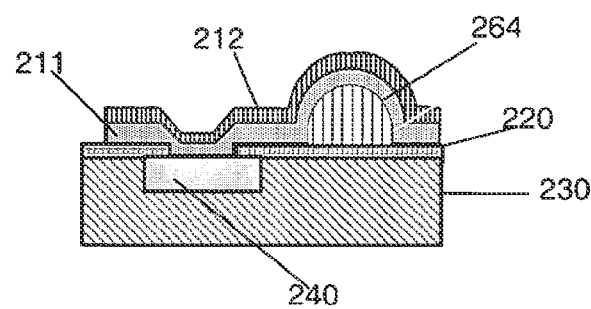

FIG. 2*f* illustrates a second metal layer 212 deposited on the first metal layer 211. As illustrated, the second metal layer 212 is depdsited over substantially all of the compliant interconnect 106, including the fixed portion 108 and the spring portion 110. The second metal layer 212 may be a metal such as aluminum (Al) copper (Cu), titanium (Ti), nickel (Ni), platinum (Pt), gold (Au), silver (Ag), tin (Sn), tantalum (Ta), molybdenum (Mo), chromium (Cr), cobalt (Co), or another material or alloy. The second metal layer 212 may be deposited by employing a method such as sputtering, chemical vapor deposition, physical vapor deposition, atomic layer deposition, electro plating, electroless plating, or another method. In an embodiment, the second metal layer 212 may be the bonding layer 114 of the compliant interconnect 106. In other embodiments, additional metal layers may be deposited on the second metal layer 212 in a similar manner. One of these additional layers may be the bonding layer 114 of the compliant interconnect 106. In other embodiments, only one metal layer, the first 211, may be deposited. This first metal layer 211 may be the bonding layer 114 of the compliant interconnect 106. In yet other embodiments, none of the metal layers 211, 212 deposited over substantially all of the compliant interconnect 106 is used as the bonding layer 114 of the compliant interconnect 106; a different layer or structure may be the bonding layer 114 of the compliant interconnect 106.

Figure 2G:
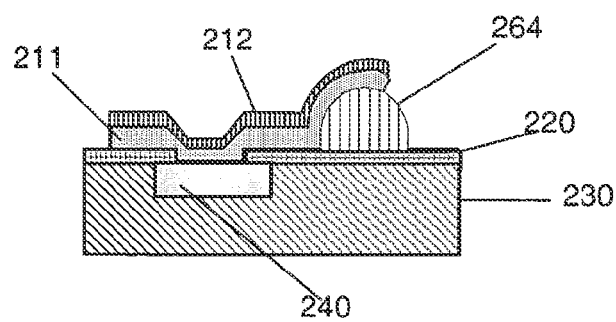
Figure 2H:
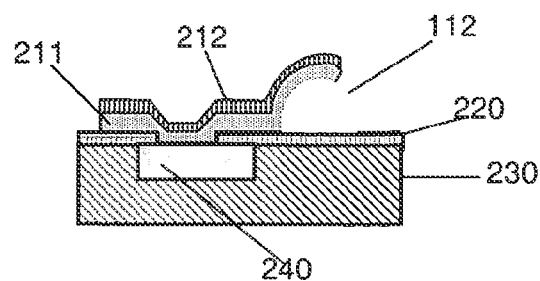

FIG. 2*g* illustrates the compliant interconnect 106 formed by patterning and etching to remove a portion of the first and second metal layers 211, 212, to result in the structure as shown in FIG. 2*g*. FIG. 2*h* illustrates the compliant interconnect 106 formed by stripping the polymer dome 264 away to form the gap 112 between the spring portion 110 and the substrate 230.

While the compliant interconnect 106 has been described with two metal layers 211, 212, compliant interconnects 106 with more or fewer metal layers may be formed. For example, the compliant interconnect 106 may have only one metal layer 211, or may have three or more metal layers. Each metal layer may cover substantially all of the top surface of the compliant interconnect 106 or may cover only a portion of the surface.

FIGS. 3*a* through 3*d* are cross sectional side views that illustrate how the die 102 may be bonded to the package substrate 150 with a metal to metal bond and without solder, according to some embodiments of the present invention.

Figure 3A:
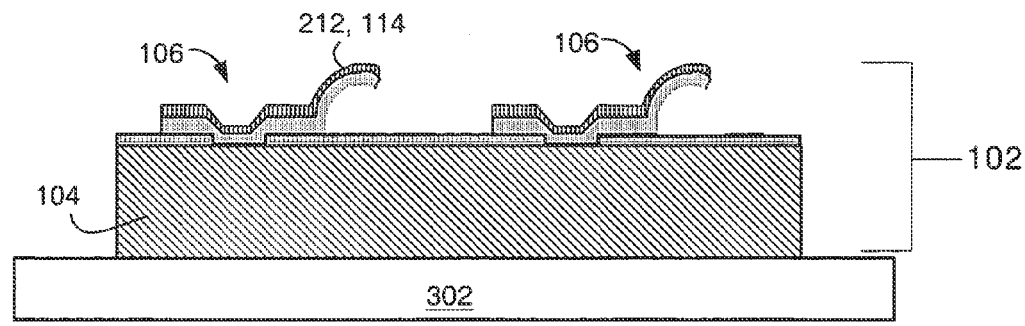
FIGS. 3a through 3d are cross sectional side views according to one embodiment of the invention that illustrate how the die may be bonded to the package substrate with a metal to metal bond and without solder.

FIG. 3*a* illustrates the die 102 with multiple compliant interconnects 106. In the illustrated embodiment, the second metal layer 212 may be the bonding layer 114 to be bonded to the package substrate 150. In other embodiments, other layers on the spring portion 110 furthest from the die substrate 104 may be the bonding layer 114. Such layers will be referred to as the "external layer" of the compliant interconnect 106. In the illustrated embodiment, an integrated heat sink (IHS) 302 has been attached to the die 102.

Figure 3B:
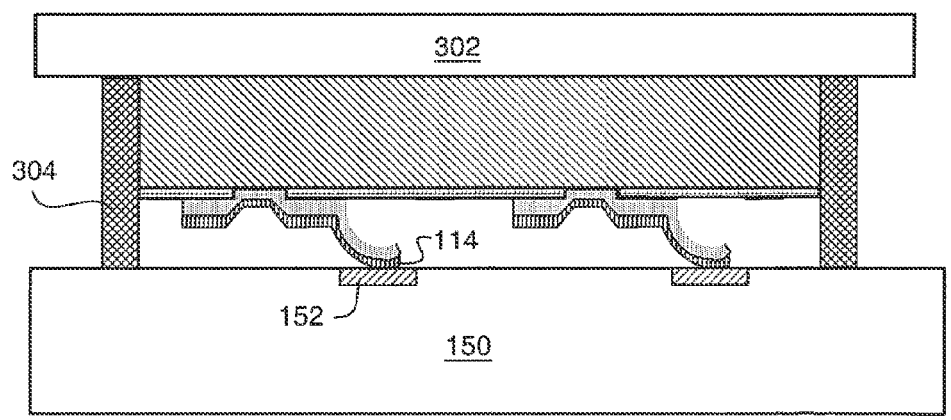

FIG. 3b illustrates the die 102 positioned adjacent the package substrate 150. The die 102 has been positioned so the external layer 212, 114 of the compliant interconnects 106 are in contact with the land pads 152 of the package substrate 150. Prior to positioning, the die 102 and package substrate 150 may be cleaned of oxides or other materials that may interfere with the metal to metal bonding. The bonding layer 114 of the compliant interconnects 106 are aligned to contact a bonding layer of the land pad 152, to allow metal to metal bonding between the two bonding layers. Underfill material 304 may be applied near the edges of the die 102 or elsewhere. This may help prevent the die 102 from moving during bonding, and keep the compliant interconnects 106 aligned with the land pads 152.

Figure 3C:
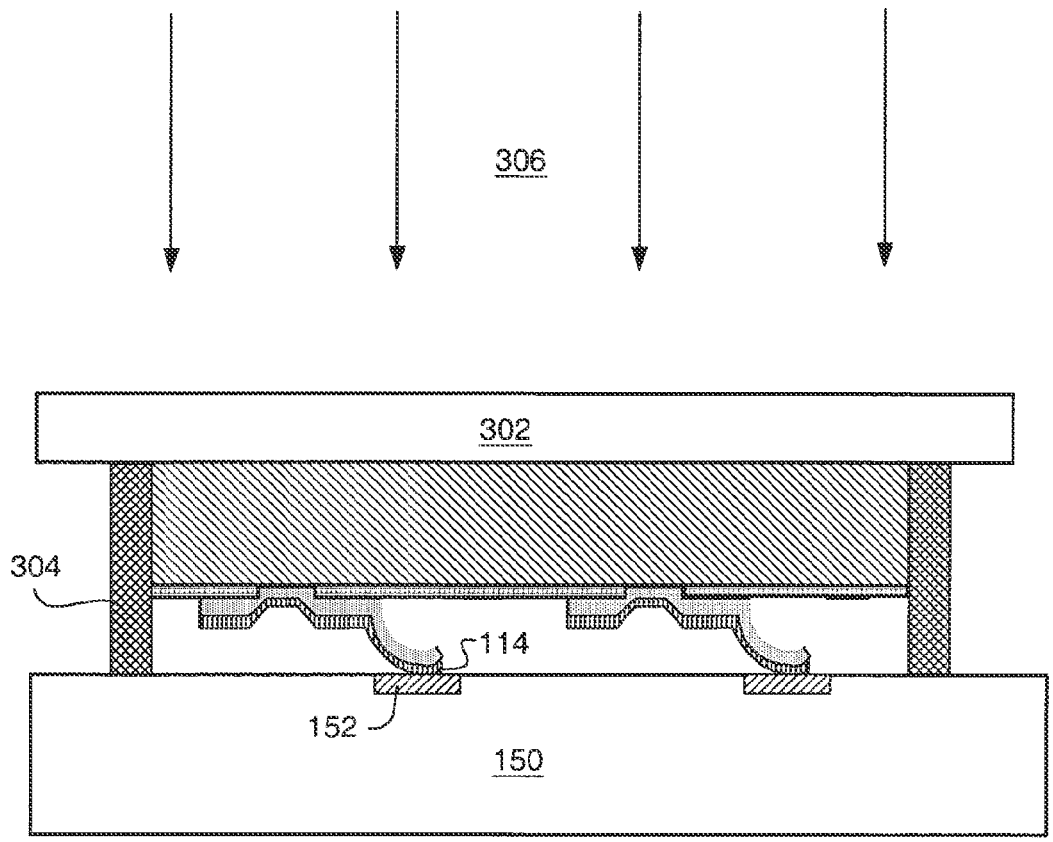

FIG. 3c illustrates heat and pressure 306 applied to the positioned die 102 and package substrate 150. Applying heat and pressure 306 may cause the bonding layer 114 of the compliant interconnect 106 to form a metal to metal bond with the bonding layer of the land pad 152. In an embodiment, heat is applied to raise the temperature of the bonding layers 114, 152 to a range between about 200 and 400 degrees Celsius. In another embodiment, heat is applied to raise the temperature to a range between about 300 and 400 degrees Celsius. In another embodiment, heat is applied to raise the temperature to a range below about 400 degrees Celsius. In some embodiments, the temperature is kept low enough that substantially none of the metal material that bonds the compliant substrate 106 to the bond pad 152 melts in the bonding process. In an embodiment, a pressure between about 2 kN and about 40 kN is applied to an apparatus 100 with about 3000 compliant interconnect 106/bond pad 152 pairs. In some embodiments, a stress of between about 0.05 MPa to about 1.0 MPa is applied to the die 102. In other embodiments, a stress of about 0.6 MPa is applied to the die 102. In some embodiments, the stress or pressure applied is less than the amount that would cause plastic deformation of the spring portion 110 of the compliant interconnect 106. In one embodiment, a pressure of about 40 kN and a temperature of about 400 degrees Celsius are applied to an apparatus 100 with about 3000 compliant interconnect 106/bond pad 152 pairs for about 5 minutes to form a metal to metal bond between the bonding layer 114 of the compliant interconnect 106 and the bonding layer of the land pad 152. In another embodiment, a pressure of about 40 kN and a temperature of about 300 degrees Celsius are applied to an apparatus 100 with about 3000 compliant interconnect 106/bond pad 152 pairs for about 30 minutes to form a metal to metal bond between the bonding layer 114 of the compliant interconnect 106 and the bonding layer of the land pad 152.

Figure 3D:
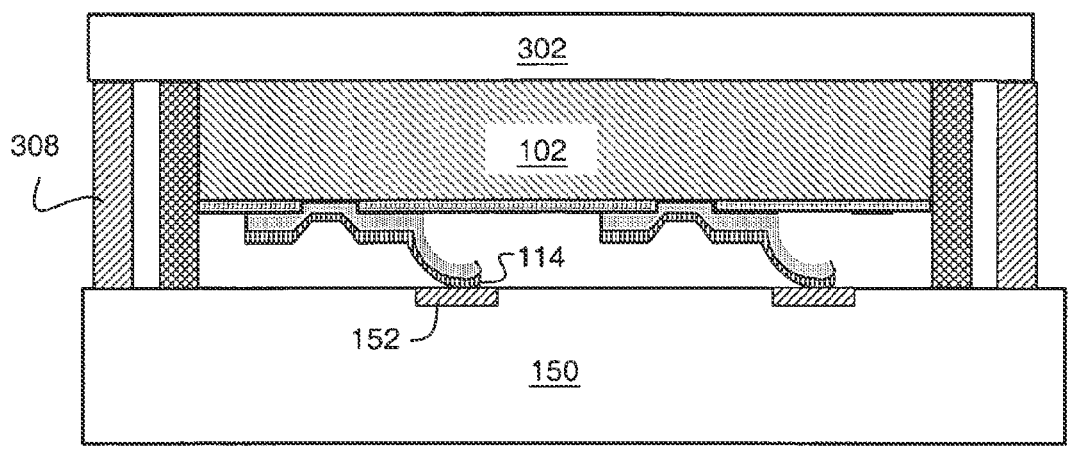

FIG. 3d illustrates the apparatus 100 after a metal to metal bond has been formed between the bonding layer 114 of the compliant interconnect 106 and the bonding layer of the land pad 152. A sealant 308 has been added between the package substrate 150 and the IHS 302 and cured to provide additional mechanical support and prevent contamination.

In other embodiments, there may be differences in the method used to bond the die 102 to the package substrate 150 with a metal to metal bond, as well as the structures bonded. For example, in one alternative embodiment, an IHS 302 is not attached to the die 102 during the underfill and bond formation steps described above with respect to FIGS. 3a through 3c. Rather, an IHS 302 may be attached to the die 102 after the bond has been formed. Other embodiments may use different processes and structures.

Figure 4A:
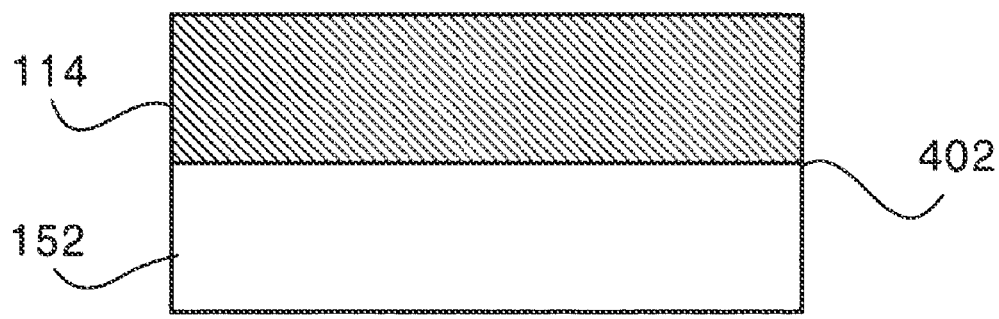
FIGS. 4a and 4b are cross sectional side views that illustrate how the bonding layer of the compliant interconnect and the bonding layer of the land pad form a single unified interlayer.
Figure 4B:
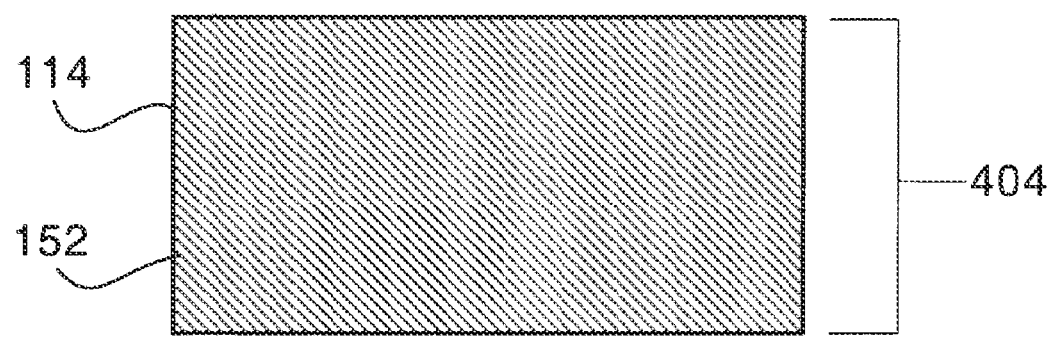

FIGS. 4a and 4b are cross sectional side views that illustrate how the bonding layer 114 of the compliant interconnect 106 and the bonding layer of the land pad 152 form a single unified interlayer that bonds the compliant interconnect 106 to the land pad 152 when a metal to metal bond is formed. FIG. 4a illustrates the bonding layer 114 in contact with the separate bonding layer of the land pad 152. In some embodiments, both the bonding layers 114, 152 may be copper. In other embodiments, the bonding layers 114, 152 may be silver, gold, or another material. There is a boundary 402 between the separate bonding layers 114, 152.

FIG. 4b illustrates the unified interlayer 404 formed in some embodiments from the separate bonding layers 114, 152 after application of pressure and heat. As seen in the Figure, the boundary 402 between the bonding layers 114, 152 is substantially gone; the two separate bonding layers 114, 152 have formed a unified, substantially boundaryless, interlayer 404. Such a boundaryless unified interlayer 404 may form if there is metal grain growth across the former boundary 402 of the bonding layers 114, 152. In other embodiments, the unified interlayer 404 may include the two bonding layers 114, 152 bonded together, and also still include the boundary 402 that has remained in place during the bonding process. The metals of the bonding layers 114, 152 have formed a metal to metal bond.

Figure 5A:
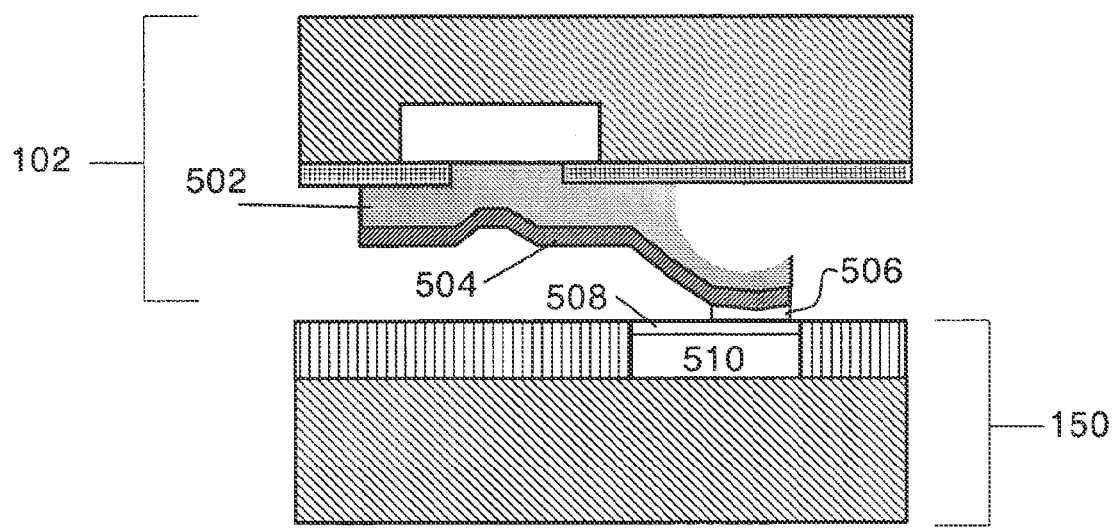
FIGS. 5a and 5b are cross sectional side views that illustrate other embodiments of bonding layers of the compliant interconnect and land pad.
Figure 5B:
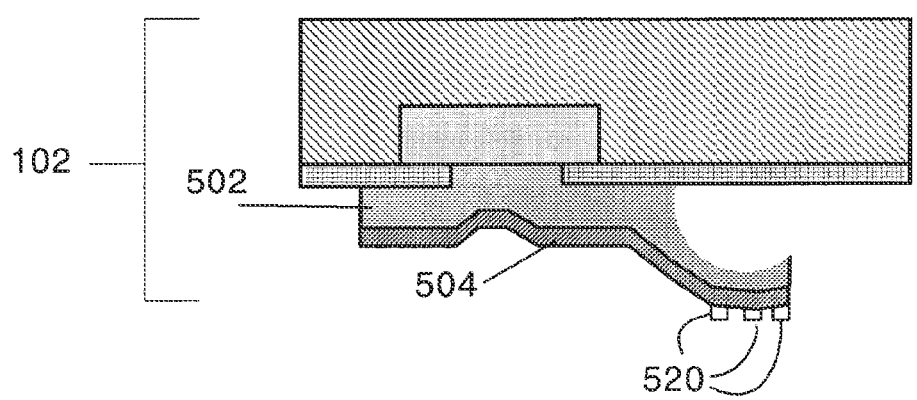

FIGS. 5a and 5b are cross sectional side views that illustrate other embodiments of bonding layers 114, 152 of the compliant interconnect 106 and land pad 152. FIG. 5a illustrates a compliant interconnect 106 with a first metal layer 502, a second metal layer 504, and a thin bonding layer 506. Other embodiments may lack the second metal layer 504, with a thin bonding layer 506 on the first metal layer. In the illustrated embodiment, the thin bonding layer 506 covers only part of the surface of the compliant interconnect 106. The thin bonding layer 506 covers a part of the spring portion 110. In other embodiments, the thin bonding layer 506 may cover more of the compliant interconnect 106, such as substantially all of the spring portion 110 and fixed portion 108. In an embodiment, the thin bonding layer 506 may be less than about 250 nanometers thick. In other embodiments, the thin bonding layer 506 may be less than 100 nanometers thick, or less than 20 nanometers thick. In some embodiments, the thin bonding layer 506 may be between about 3-10 nanometers thick. In an embodiment, the thin bonding layer 506 may be about 5 nanometers thick.

The thin bonding layer 506 may be formed, for example, by selectively depositing a thin bonding layer 506 of silver on a copper second metal layer 504, such as by electroplating, electroless plating, contact displacement plating (i.e., a displacement reaction), or another method. In another embodiment, the thin bonding layer 506 may be a thin layer of gold on a second metal layer 504 of copper, with a layer of nickel (not shown) between the gold and copper and acting as a barrier between the two.

The package substrate 150 may include a thin metal bonding layer 508 on another pad layer 510 as part of the land pad 152. The thin metal bonding layer 508 may have a thickness similar to that described above for the thin bonding layer 506. The thin metal bonding layer 508 of the land pad 152 may be a layer of copper or another material. For example, in one embodiment the thin metal bonding layer 508 may be a thin layer of silver 508 selectively deposited on a layer of copper 510, similar to that described above with respect to the compliant interconnect 106. In another embodiment, the thin metal bonding layer 508 may be a thin layer of gold on a layer 510 of copper, with a layer of nickel (not shown) between the gold and copper and acting as a barrier between the two. In yet another embodiment, there may be a thin bonding layer 506 on the compliant interconnect 106, such as a thin silver layer on a copper second metal layer 504, and the land pad 152 may comprise copper without a thin silver layer. The thin silver bonding layer 506 of the compliant interconnect 106 may bond to the land pad 152 when heat and pressure is applied to form a metal to metal bond between the die 102 and the package substrate 150. In another similar embodiment, there may be a thin metal bonding layer 508, such as a thin silver layer, as part of the land pad 152, and the second metal layer 504 (or whatever layer of the compliant interconnect 106 closest to the land pad 152) may be a copper layer without a thin silver layer. The thin silver bonding layer 508 of the land pad 152 may bond to the compliant interconnect 106 when heat and pressure is applied to form a metal to metal bond between the die 102 and the package substrate 150.

FIG. 5b illustrates an embodiment where, instead of a thin bonding layer 506, discrete islands 520 of bonding material are on the second metal layer 504. In one embodiment, where the second metal layer 504 comprises copper, the discrete islands 520 comprise silver. However, it should be understood that other combinations of metals may provide the desired island structure (e.g., islands comprising gold).

In one embodiment, the islands 520 have an average width dimension in a range of between 1 and 100 nm. In another embodiment, this average width is between 1 and 5 times the film thickness. The width of each island 520 is small in comparison to a bulk solid and, therefore, the distance that an atom of an island 520 has to diffuse laterally to leave the center of the island is relatively small as compared to a bulk solid. Because of this property, as well as the large surface to volume ratio of the islands 520, the metal will exhibit rapid creep during application of heat and pressure to form the metal to metal bond, which is a deformation mechanism in which stress is decreased by the motion of atoms to produce deformations. In one embodiment, the islands 520 are selectively deposited on the second metal layer 504 using any suitable deposition method, such as contact displacement plating, electroless plating, or electroplating. In another embodiment, an island morphology may be created using a blanket (or selective) deposition process, followed by photolithography and subsequent etching. In some embodiments, both the compliant interconnect 106 and the land pad 152 may have such islands 520. In other embodiments, only one of the compliant interconnect 106 and the land pad 152 may have such islands.

Figure 6A:
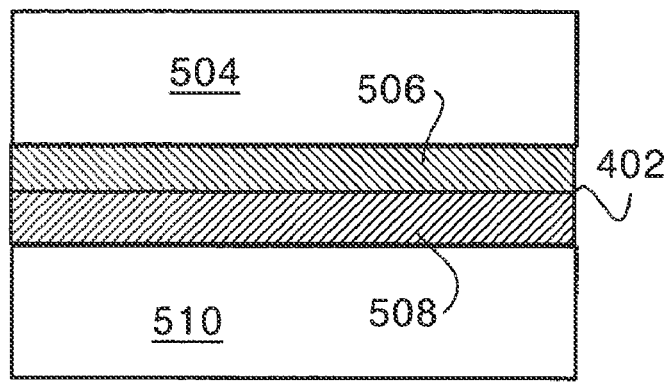
FIGS. 6a and 6b are cross sectional side views that illustrate how the thin bonding layer of the compliant interconnect and the thin bonding layer of the land pad form a single unified interlayer.
Figure 6B:
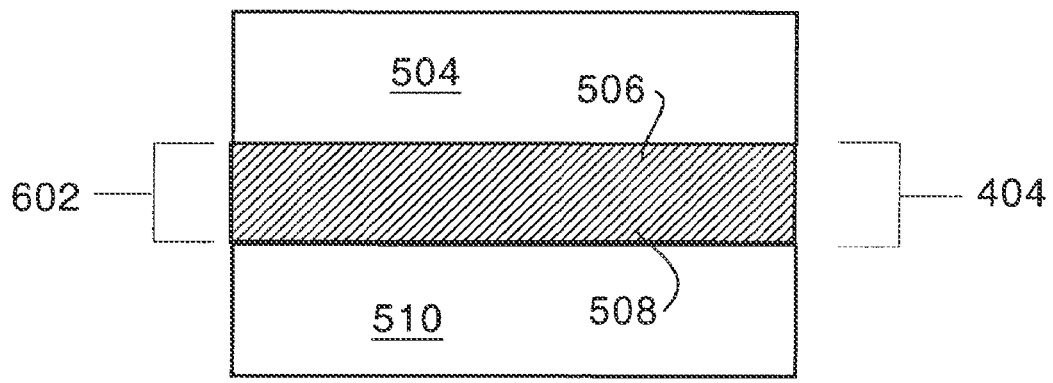

FIGS. 6a and 6b are cross sectional side views that illustrate how the thin bonding layer 506 of the compliant interconnect 106 and the thin bonding layer 508 of the land pad 152 form a single unified interlayer 404 that bonds the compliant interconnect 106 to the land pad 152 when a metal to metal bond is formed. FIG. 6a illustrates the thin bonding layer 506 of the compliant interconnect 106 in contact with the separate thin bonding layer 508 of the land pad 152. As mentioned above, in some embodiments, both the bonding layers 506, 508 may be a thin silver layer 506 on a copper second metal layer 504 and a thin silver layer 508 on a copper pad layer 510. In other embodiments, the bonding layers 506, 508 may be another material. There is a boundary 402 between the separate bonding layers 506, 508.

FIG. 6b illustrates the unified interlayer 404 formed in some embodiments from the separate bonding layers 506, 508 after application of pressure and heat to form a metal to metal bond. As seen in FIG. 6b, the boundary 402 between the bonding layers 506, 508 is substantially gone; the two separate bonding layers 506, 508 have formed a unified, substantially boundaryless, interlayer 404. Such a boundaryless unified interlayer 404 may form if there is metal grain growth across the former boundary 402 of the bonding layers 506, 508. In other embodiments, the unified interlayer 404 may include the two bonding layers 506, 508 bonded together, and also still include the boundary 402 that has remained in place during the bonding process. The metals of the bonding layers 506, 508 have formed a metal to metal bond. In some embodiments, the unified interlayer 404 formed from the separate bonding layers 506, 508 may have a thickness 602 of about 3-10 nanometers. In other embodiments, the unified interlayer 404 may have a thickness 602 of about 6 to about 20 nanometers. In yet other embodiments, the unified interlayer 404 may have a thickness of less than 250 nanometers.

In another embodiment described above, where only one of the die 102 or substrate 150 may have a thin layer 506 or 508, the application of heat and pressure may bond the single thin layer to whichever one of the die 102 or substrate 150 to which it was not originally attached. The single thin layer 506 or 508 will form the unified interlayer 404 that is bonded to both the die 102 and substrate 150. In such an embodiment, a boundary between two bonding layers may not disappear. Rather, the single thin layer 506 or 508 on a first component may simply bond to a metal layer of the second component. As the single thin layer 506 or 508 will be bonded to both components and thus bond the components together, the single thin layer 506 or 508 may thus also be considered a unified interlayer 404, even though forming it did not involve removal of a boundary 402 as described in the embodiments above.

Figure 7:
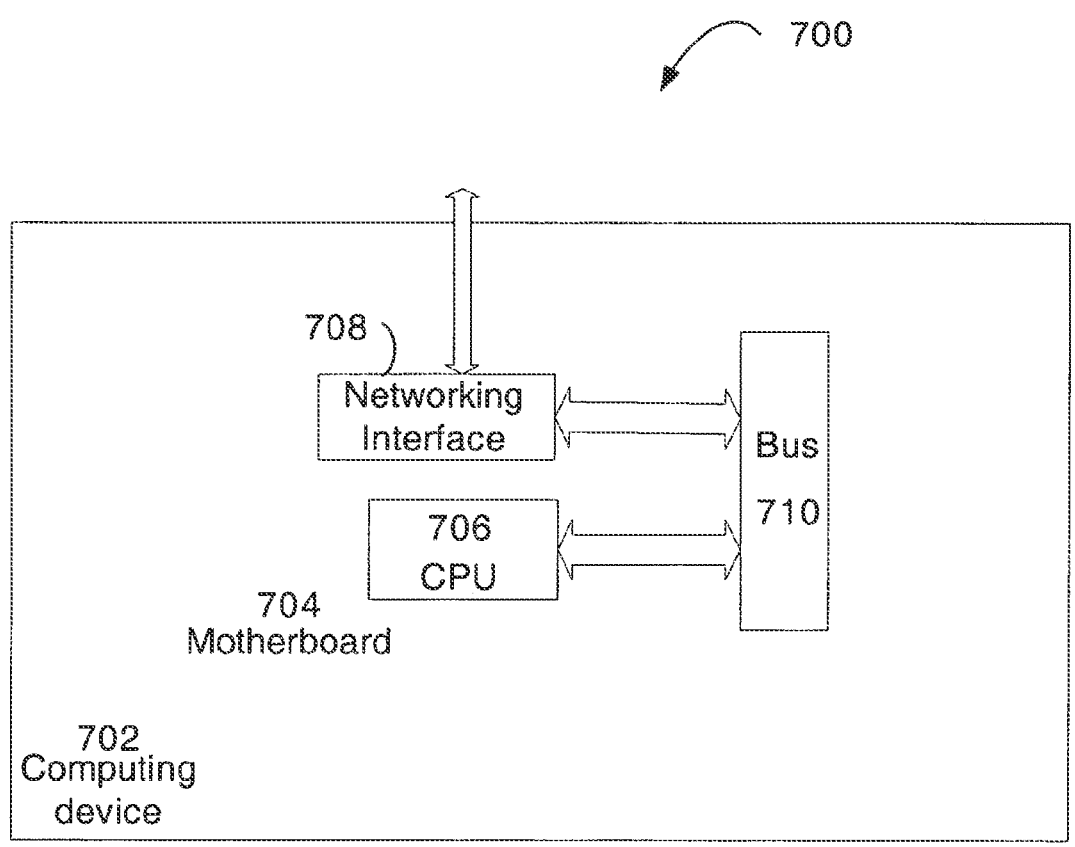
FIG. 7 illustrates a system in accordance with one embodiment.

FIG. 7 illustrates a system 700 in accordance with one embodiment. As illustrated, for the embodiment, system 700 includes computing device 702 for processing data. Computing device 702 may include a motherboard 704. Motherboard 704 may include in particular a processor 706, and a networking interface 708 coupled to a bus 710. More specifically, processor 706 may comprise the apparatus 100 endowed with the earlier described compliant interconnects. In alternate embodiments, system 700 may include other semiconductor components having compliant interconnects bonded to other components with a metal to metal bond as earlier described.

Depending on the applications, system 700 may include other components, including but are not limited to volatile and non-volatile memory, a graphics processor, a digital signal processor, a crypto processor, a chipset, mass storage (such as hard disk, compact disk (CD), digital versatile disk (DVD) and so forth), and so forth. One or more of these components may also include the earlier described compliant interconnects.

In various embodiments, system 700 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A device comprising:
a package substrate having a surface and a metal layer disposed on a portion of the surface;
an integrated circuit (IC) die having a passivation layer and a pad;
a compliant interconnect electrically coupling the IC die and the package substrate, the compliant interconnect having:
a fixed portion coupled with the pad on the IC die; and
a spring portion extending from the fixed portion, at least part of the spring portion disposed over the passivation layer, the spring portion being separated from the passivation layer by an un-filled gap;
wherein the spring portion may flex into the un-filled gap and into a closer proximity to the passivation layer upon application of a force that may be applied perpendicular to the passivation layer; and
a bonding layer disposed between the metal layer of the package substrate and at least part of the spring portion, the bonding layer coupling the spring portion with the metal layer.

2. The device of claim 1, further comprising a unified interlayer with a thickness less than about 10 nanometers directly in contact with the compliant interconnect and the pad.

3. The device of claim 1, wherein the compliant interconnect comprises a layer of a first material, the pad comprises a layer of a second material, and the layer of the compliant interconnect and the layer of the pad are bonded together.

4. The device of claim 3, wherein the first material is substantially the same material as the second material.

5. The device of claim 3, wherein both the first and second materials comprise a material selected from the group consisting of copper, gold, and silver.

6. The device of claim 3, wherein the first material is a different material from the second material.

7. The device of claim 1, wherein the compliant interconnect comprises a spring portion, a fixed portion, and a layer that extends over substantially all of the spring portion and the fixed portion.

8. A device comprising:
a passivation layer coupled with a die, and a pad on a package substrate;
a compliant interconnect layer having:
a fixed portion in contact with a die substrate comprising a die; and
a spring portion extending from the fixed portion and over the passivation layer, the spring portion being separated from the passivation layer by an un-filled gap, wherein the spring portion may be flexed into the un-filled gap and into a closer proximity to the passivation layer upon application of a force that may be applied perpendicular to the passivation layer; and
a bonding layer on the spring portion, wherein the bonding layer covers only a part of the spring portion.

9. The device of claim 8 wherein the compliant interconnect is disposed between the package substrate and the die substrate.

10. The device of claim 8 wherein bonding layer may comprise a metal formed by chemical vapor deposition.

\* \* \* \* \*